(12) United States Patent
Xu

(10) Patent No.: US 12,107,413 B2
(45) Date of Patent: Oct. 1, 2024

(54) SWITCH PROTECTION CIRCUIT AND POWER CONVERTER SUITED FOR DIFFERENT INPUT VOLTAGE RANGES

(71) Applicant: Joulwatt Technology Co., Ltd., Hangzhou (CN)

(72) Inventor: Aimin Xu, Hangzhou (CN)

(73) Assignee: JOULWATT TECHNOLOGY CO., LTD., Hangzhou (CN)

( * ) Notice: Subject to any disclaimer, the term of this patent is extended or adjusted under 35 U.S.C. 154(b) by 379 days.

(21) Appl. No.: 17/692,702

(22) Filed: Mar. 11, 2022

(65) Prior Publication Data

US 2022/0294208 A1  Sep. 15, 2022

(30) Foreign Application Priority Data

Mar. 12, 2021 (CN) .......................... 202110269284.4

(51) Int. Cl.
*H02H 7/12* (2006.01)
*H02H 1/00* (2006.01)
(52) U.S. Cl.
CPC ........ H02H 7/1213 (2013.01); H02H 1/0007 (2013.01)
(58) Field of Classification Search
CPC ... H02H 1/0007; H02H 7/1213; H02M 1/088; H02M 1/34; H02M 1/4291; H02M 3/1582; H02M 1/0095; H03K 17/0822; H03K 17/082; H03K 2217/0063; H03K 2217/0072; H05B 45/375; H02P 2201/11
See application file for complete search history.

(56) References Cited

U.S. PATENT DOCUMENTS

| 8,310,795 | B2 * | 11/2012 | Yabuzaki ............ H02M 1/4225 361/18 |
| 10,355,604 | B2 * | 7/2019 | Wong ..................... H02M 1/096 |
| 11,223,276 | B1 * | 1/2022 | Cai ........................ H02M 3/158 |
| 2011/0018515 | A1 * | 1/2011 | McCloy-Stevens ........................ H02M 3/1588 323/284 |
| 2011/0141631 | A1 | 6/2011 | Yabuzaki et al. |
| 2018/0062526 | A1 | 3/2018 | Wong et al. |
| 2019/0334429 | A1 * | 10/2019 | Luo .......................... H02M 1/08 |
| 2020/0177090 | A1 * | 6/2020 | Braz ....................... H02M 1/08 |

FOREIGN PATENT DOCUMENTS

| CN | 111697828 A | * | 9/2020 |
| CN | 112910424 A | | 9/2020 |
| CN | 112510972 A | | 6/2021 |

* cited by examiner

*Primary Examiner* — Jared Fureman
*Assistant Examiner* — Nicolas Bellido
(74) *Attorney, Agent, or Firm* — Treasure IP Group, LLC

(57) ABSTRACT

Disclosed is a switch protection circuit and a power converter, configured to set upper and lower limit-value current signals which can be adjusted along with an input voltage, so that instantaneous power of a main power switch can be prevented from being too high, and the main power switch can always be operated within a safe operating range, thereby solving the problem that the power converter is easy to be damaged in applications under a high-current circumstance.

14 Claims, 2 Drawing Sheets

SWITCH PROTECTION CIRCUIT AND POWER CONVERTER SUITED FOR DIFFERENT INPUT VOLTAGE RANGES

CROSS-REFERENCE TO RELATED APPLICATIONS

The present application claims priority to the Chinese Patent Application No. 202110269284.4, filed on Mar. 12, 2021, and entitled "SWITCH PROTECTION CIRCUIT AND POWER CONVERTER", which is incorporated herein by reference in its entirety.

FIELD OF TECHNOLOGY

The present disclosure relates to a technical field of power electronics, in particular to a switch protection circuit and a power converter.

BACKGROUND

In applications of a switching circuit under high-current circumstance, a main power switch of the switching circuit is often required to withstand a high current, so that the instantaneous power of the main power switch may reach a very high level when an input voltage is relatively high, which may cause damage to the main power switch. Therefore, it is necessary to protect and control the main power switch which may be operated under different input voltage ranges, in order to improve the stability of the switching circuit.

SUMMARY OF THE INVENTION

In view of this, an objective of the present disclosure is to provide a switch protection circuit and a power converter for solving a technical problem that the main power switch may be damaged under different input voltage ranges.

A technical solution of the present disclosure is to provide a switch protection circuit used in the switching circuit, which comprises a main power switch and an inductor. The switch protection circuit comprises:
a limit setting circuit, configured to receive an input voltage of the switching circuit and output an adjustable upper limit-value signal and an adjustable lower limit-value signal according to the input voltage;
a protection control circuit, configured to receive the upper limit-value signal, the lower limit-value signal, and receive a current sampled signal representing current information of the inductor, and control an on/off state of the main power switch according to a comparison result obtained by comparing the upper limit-value signal and the lower limit-value signal with the current sampled signal, so as to limit a magnitude of a current flowing through the main power switch.

In some embodiments, the limit setting circuit is configured to control the upper limit-value signal and the lower limit-value signal to change in an opposite trend to the input voltage.

In some embodiments, a difference between the upper limit-value signal and the lower limit-value signal is a fixed value.

In some embodiments, the limit setting circuit comprises a first comparator circuit and a regulator circuit. The first comparator circuit is configured to receive the input voltage and a threshold voltage and output a comparison signal. The regulator circuit is configured to receive the comparison signal and control the upper limit-value signal and the lower limit-value signal to be higher or lower according to the comparison signal.

In some embodiments, the regulator circuit is configured to control the upper limit-value signal and the lower limit-value signal to be higher or lower by shifting between preset levels, or control the upper limit-value signal and the lower limit-value signal to be higher or lower in accordance with a preset functional relation.

In some embodiments, the protection control circuit comprises a second comparator circuit and a logic circuit. The second comparator circuit is configured to receive the current sampled signal and respectively compare the upper limit-value signal and the lower limit-value signal with the current sampled signal, so as to obtain the comparison result. The logic circuit is configured to receive the comparison result and a PWM signal, and control the on/off state of the main power switch after performing a logical operation on the comparison result and the PWM signal.

According to another aspect, the present disclosure discloses a power converter, comprising:
a switching unit, comprising a main power switch and a freewheeling switch connected in series;
an inductor, connected to the switching unit and used for storing and releasing energy during operating process of the power converter;
a switch protection circuit, configured to protect the main power switch in the switching unit, wherein the switch protection circuit is configured to receive an input voltage of the switching circuit, generate an adjustable upper limit-value signal and an adjustable lower limit-value signal according to the input voltage, and obtain a comparison result for controlling an on/off state of the main power switch by comparing the upper limit-value signal, the lower limit-value signal with a current sampled signal representing current information of the inductor or current information of the switching unit, so as to limit a magnitude of a current flowing through the main power switch.

In some embodiments, the switch protection circuit comprises a limit setting circuit and a protection control circuit. The limit setting circuit is configured to receive an input voltage of the switching circuit and generate an adjustable upper limit-value signal and an adjustable lower limit-value signal according to the input voltage. The protection control circuit is configured to receive the upper limit-value signal and the lower limit-value signal, and obtain the comparison result for controlling the on/off state of the main power switch by comparing the upper limit-value signal and the lower limit-value signal with the current sampled signal.

In some embodiments, the limit setting circuit is configured to control the upper limit-value signal and the lower limit-value signal to change in an opposite trend to the input voltage.

In some embodiments, a difference between the upper limit-value signal and the lower limit-value signal is a fixed value.

In some embodiments, the power converter is a BUCK-type power converter.

In some embodiments, the limit setting circuit comprises a first comparator circuit and a regulator circuit. The first comparator circuit is configured to receive the input voltage and a threshold voltage, and output a comparison signal. The regulator circuit is configured to receive the comparison signal and adjust the upper limit-value signal and the lower limit-value signal to be higher or lower according to the comparison signal.

In some embodiments, the regulator circuit is configured to adjust the upper limit-value signal and the lower limit-value signal to be higher or lower by shifting between preset levels, or adjust the upper limit-value signal and the lower limit-value signal to be higher or lower in accordance with a preset functional relation.

In some embodiments, the protection control circuit comprises a second comparator circuit and a logic circuit. The second comparator circuit is configured to receive the current sampled signal, and respectively compare the upper limit-value signal, the lower limit-value signal with the current sampled signal to obtain the comparison result. The logic circuit is configured to receive the comparison result and a PWM signal, and control the on/off state of the main power switch after performing a logical operation on the comparison result and the PWM signal.

By using a circuit structure according to embodiments of the present disclosure and by means of setting upper and lower limit reference currents which can be adjusted along with the input voltage, instantaneous power of the main power switch can be prevented from being too high, thus the main power switch can always be operated within a safe operating range, thereby solving the problem that the power converter is easy to be damaged in applications under a high-current circumstance.

BRIEF DESCRIPTION OF THE DRAWINGS

In order to illustrate technical solutions according to embodiments of the present application more clearly, drawings of some embodiments are briefly described hereafter. Obviously, the drawings in the following description only relate to some embodiments of the present application, and are not intended to limit the present application.

DESCRIPTION OF THE EMBODIMENTS

Preferred embodiments of the present disclosure are described below in detail in conjunction with the accompanying drawings, however the present disclosure is not limited to these embodiments. The present disclosure is intended to cover any kind of alternative, modification, equivalent method and solution, which may be made within the spirit and scope of the present disclosure.

In order to make the present disclosure thoroughly understood by the public, specific details are described elaborately in the following preferred embodiments of the present disclosure, and one skilled in the art may fully understand the present disclosure without those specific details.

In following paragraphs, the present disclosure is described in more detail by giving examples and referring to the accompanying drawings. It should be noted that the drawings are all in a simplified form and may not be drawn in a precise proportion, and the drawings are only used to make convenient and clear explanations on embodiments of the present disclosure.

Figure 1:
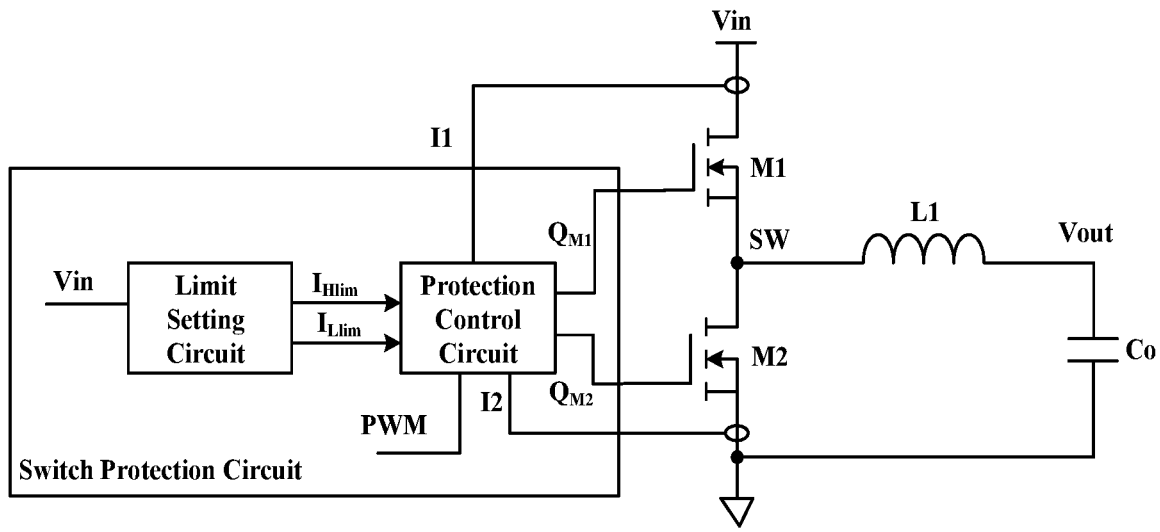
FIG. 1 shows a circuit diagram of a power converter according to the present disclosure.
Figure 2:
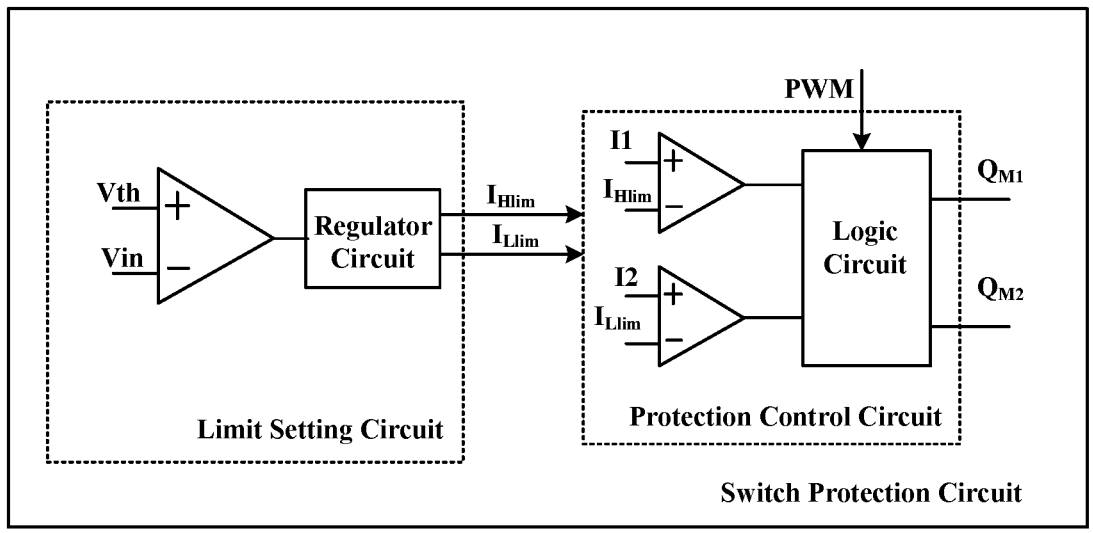
FIG. 2 shows a circuit diagram of an embodiment of a switch protection circuit according to the present disclosure.
Figure 3:
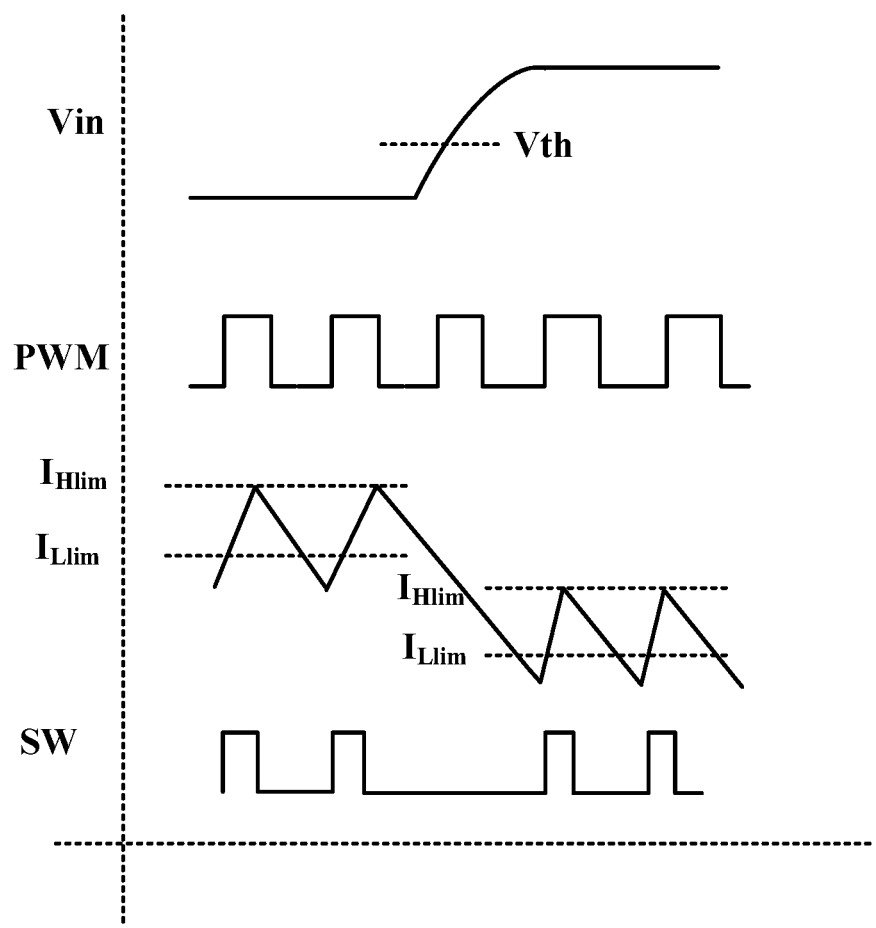
FIG. 3 shows an operating waveform diagram of a power converter according to the present disclosure.

FIG. 1 shows a circuit diagram of a power converter according to the present disclosure, FIG. 2 shows a circuit diagram of an embodiment of a switch protection circuit according to the present disclosure, and FIG. 3 shows an operating waveform diagram of the power converter according to the present disclosure. The power converter shown in FIG. 1 comprises a switching unit and an inductor L, the switching unit comprises a main power switch M1 and a freewheeling switch M2. In an embodiment, the switching unit and the inductor form a BUCK-type power converter. The power converter further comprises an input terminal for receiving an input voltage Vin and an output terminal for providing an output voltage Vout.

In an embodiment, the switch protection circuit comprises a limit setting circuit and a protection control circuit. The limit setting circuit is configured to receive an input voltage Vin of the switching circuit and generate an adjustable upper limit-value signal $I_{Hlim}$ and an adjustable lower limit-value signal $I_{Llim}$ according to the input voltage. The protection control circuit is configured to receive the upper limit-value signal and the lower limit-value signal, obtain a comparison result for controlling an on/off state of the main power switch by comparing the upper limit-value signal $I_{Hlim}$ and the lower limit-value signal $I_{Llim}$ with a current sampled signal representing a current of the inductor or a current of the switching unit, so as to limit a magnitude of a current flowing through the main power switch. The current sampled signal representing the current of the inductor or the current of the switching unit can be obtained by conventional technical means, for example, the current sampled signal may be obtained by sampling at a node connected between the inductor and the switching unit by use of a resistor device, or by sampling at a switching node connected between the main power switch and the freewheeling switch in the switching unit by use of a resistor device.

In an embodiment, the limit setting circuit is configured to control the upper limit-value signal and the lower limit-value signal to be changed in an opposite trend to the input voltage, meaning that the upper limit-value signal and the lower limit-value signal may decrease with the increase of the input voltage, or the upper limit-value signal and the lower limit-value signal may increase with the decrease of the input voltage. In another embodiment, a difference between the upper limit-value signal and the lower limit-value signal is a fixed value. Based on this, the upper limit-value signal and the lower limit-value signal may change synchronously with the input voltage during adjustment process, for example, the upper limit-value signal and the lower limit-value signal may decrease synchronously by a certain value or increase synchronously by a certain value following a change of the input voltage.

Referring to FIG. 2, the limit setting circuit comprises a first comparator circuit and a regulator circuit, wherein the first comparator circuit is configured to receive the input voltage Vin and a threshold voltage Vth, and output a comparison signal; the regulator circuit is configured to receive the comparison signal, and adjust the upper limit-value signal and the lower limit-value signal to be higher or lower according to the comparison signal. In an embodiment, the regulator circuit may adjust the upper limit-value signal and the lower limit-value signal to be higher or lower by shifting between preset levels. For example, the regulator circuit may adjust the upper limit-value signal and the lower limit-value signal to a low level when the comparison signal indicates that the input voltage Vin rises to the threshold voltage Vth, in order to reduce values of the upper limit-value signal and the lower limit-value signal. Or, the regulator circuit may adjust the upper limit-value signal and the lower limit-value signal to be higher or lower in accordance with a preset functional relation. For example, when the comparison signal indicates that the input voltage Vin rises to the threshold voltage Vth, the regulator circuit may gradually reduce the upper limit-value signal and the lower limit-value signal in accordance with a linear function relation or other function relation, and finally make the upper limit-value signal and the lower limit-value signal reach desired values, respectively.

In an embodiment, the protection control circuit comprises a second comparator circuit and a logic circuit, wherein the second comparator circuit comprises two comparators that compare the upper limit-value signal with the current sampled signal and compare the lower limit-value signal and the current sampled signal, respectively, so as to obtain the comparison result. In this embodiment, the current sampled signal is obtained by sampling at a node of the switch, thus the current sampled signal comprises a current signal I1 when the main power switch is turned on and a current signal I2 when the freewheeling switch is turned on.

The logic circuit is configured to receive the comparison result and a PWM signal, and control the on/off state of the main power switch after performing a logical operation on the comparison result and the PWM signal. The two comparators herein are configured to generate a first comparison result and a second comparison result, respectively. In an embodiment, the first comparison result indicates whether the current sampled signal reaches the upper limit-value signal $I_{Hlim}$, and the second comparison result indicates whether the current sampled signal reaches the lower limit-value signal $I_{Llim}$.

Referring to FIG. 3, when Vin is low and the current sampled signal reaches the upper limit-value signal $I_{Hlim}$, the main power switch M1 is turned off and the freewheeling switch M2 is turned on. When the current sampled signal decreases to the lower limit-value signal $I_{Llim}$, and the PWM signal is at high level, the main power switch is turned on again, and a voltage at the switching node SW increases accordingly. When the input voltage Vin rises to the threshold voltage Vth, the upper limit-value signal and the lower limit-value signal are both reduced, as shown in FIG. 3, to a lower value respectively. At that time, the main power switch is not turned on if the PWM signal is at high level, only until next timepoint when the current sampled signal decreases to the lower limit-value signal $I_{Llim}$ and the PWM signal is at high level, the main power switch can be turned on again, and the voltage of the switching node SW can become higher.

According to the embodiments of the present disclosure, the upper and lower limit values of the current flowing through the inductor or the switch are limited, so that the magnitude of the current of the inductor can be prevented from being out of control, the condition for turning the main power switch on can be met only when the current of the inductor reaches the lower limit value, the current flowing through the inductor can be prevented from becoming higher, and the operating stability of the system can be ensured.

Taking a BUCK-type power converter as an example, when the input voltage changes, by control of the duty cycle, an average power of the power converter can be constant and the output voltage can be remained approximately constant. However, in conventional solutions, the duty cycle of the main power switch will be very small under a condition that the input voltage is high, hence the instantaneous power of the main power switch will be very large, making it easy to cause damage to the switch. Referring to the switch protection circuit and the waveform diagram described above according to the embodiments of the present disclosure, it can be known that when the input voltage becomes high, the instantaneous power of the main power switch can be reduced by controlling the current flowing through the main power switch, so that the main power switch can be operated in a safe operating range, which protects the main power switch from burning out, thereby improving the stability of the power converter.

The protection scope of the present invention should not be limited by the above-described embodiments. Any modification, equivalent substitution or improvement made within the spirit and principle of the above embodiments should be included in the protection scope of the present invention.

The invention claimed is:

1. A switch protection circuit, used in a switching circuit comprising a main power switch and an inductor, comprises:
   a limit setting circuit, configured to receive an input voltage of the switching circuit and output an adjustable upper limit-value signal and an adjustable lower limit-value signal according to the input voltage; and
   a protection control circuit, configured to receive the adjustable upper limit-value signal, the adjustable lower limit-value signal, receive a current sampled signal representing current information of the inductor, and control an on/off state of the main power switch according to a comparison result obtained by comparing the adjustable upper limit-value signal, the adjustable lower limit-value signal with the current sampled signal, so as to limit a magnitude of a current flowing through the main power switch.

2. The switch protection circuit according to claim 1, wherein the limit setting circuit is configured to control the adjustable upper limit-value signal and the adjustable lower limit-value signal to change in an opposite trend to the input voltage.

3. The switch protection circuit according to claim 2, wherein a difference between the adjustable upper limit-value signal and the adjustable lower limit-value signal is a fixed value.

4. The switch protection circuit according to claim 2, wherein the limit setting circuit comprises a first comparator circuit and a regulator circuit, wherein
   the comparator circuit is configured to receive the input voltage and a threshold voltage, and output a comparison signal,
   the regulator circuit is configured to receive the comparison signal and adjust the adjustable upper limit-value signal and the adjustable lower limit-value signal to be higher or lower according to the comparison signal.

5. The switch protection circuit according to claim 4, wherein the regulator circuit is configured to adjust the adjustable upper limit-value signal and the adjustable lower limit-value signal to be higher or lower by shifting between preset levels, or adjust the adjustable upper limit-value signal and the adjustable lower limit-value signal to be higher or lower in accordance with a preset functional relation.

6. The switch protection circuit according to claim 2, wherein the protection control circuit comprises a second comparator circuit and a logic circuit, wherein
   the second comparator circuit is configured to receive the current sampled signal and respectively compare the adjustable upper limit-value signal and the adjustable lower limit-value signal with the current sampled signal, so as to obtain the comparison result,
   the logic circuit is configured to receive the comparison result and a PWM signal, and control the on/off state of the main power switch after performing a logical operation on the comparison result and the PWM signal.

7. A power converter, comprising:
a switching unit, comprising a main power switch and a freewheeling switch connected in series;
an inductor, connected to the switching unit and used for storing and releasing energy during operating process of the power converter; and
a switch protection circuit, configured to protect the main power switch in the switching unit, wherein the switch protection circuit is configured to receive an input voltage of the switching circuit, generate an adjustable upper limit-value signal and an adjustable lower limit-value signal according to the input voltage, obtain a comparison result for controlling an on/off state of the main power switch by comparing the adjustable upper limit-value signal and the adjustable lower limit-value signal with a current sampled signal representing current information of the inductor or current information of the switching unit, so as to limit a magnitude of a current flowing through the main power switch.

8. The power converter according to claim 7, wherein the switch protection circuit comprises a limit setting circuit and a protection control circuit, wherein
the limit setting circuit is configured to receive the input voltage of the switching circuit and generate the adjustable upper limit-value signal and the adjustable lower limit-value signal according to the input voltage,
the protection control circuit is configured to receive the adjustable upper limit-value signal and the adjustable lower limit-value signal, and obtain the comparison result for controlling the on/off state of the main power switch by comparing the adjustable upper limit-value signal and the adjustable lower limit-value signal with the current sampled signal.

9. The power converter according to claim 8, wherein the limit setting circuit is configured to control the adjustable upper limit-value signal and the adjustable lower limit-value signal to change in an opposite trend to the input voltage.

10. The power converter according to claim 9, wherein a difference between the adjustable upper limit-value signal and the adjustable lower limit-value signal is a fixed value.

11. The power converter according to claim 9, wherein the limit setting circuit comprises a first comparator circuit and a regulator circuit, wherein
the first comparator circuit is configured to receive the input voltage and a threshold voltage, and output a comparison signal,
the regulator circuit is configured to receive the comparison signal and control the adjustable upper limit-value signal and the adjustable lower limit-value signal to be higher or lower according to the comparison signal.

12. The power converter according to claim 11, wherein the regulator circuit is configured to adjust the adjustable upper limit-value signal and the adjustable lower limit-value signal to be higher or lower by shifting between preset levels, or adjust the adjustable upper limit-value signal and the adjustable lower limit-value signal to be higher or lower in accordance with a preset functional relation.

13. The power converter according to claim 9, wherein the protection control circuit comprises a second comparator circuit and a logic circuit, wherein
the second comparator circuit is configured to receive the current sampled signal and respectively compare the adjustable upper limit-value signal and the adjustable lower limit-value signal with the current sampled signal to obtain the comparison result,
the logic circuit is configured to receive the comparison result and a PWM signal, and control the on/off state of the main power switch after performing logical operation on the comparison result and the PWM signal.

14. The power converter according to claim 7, wherein the power converter is a BUCK-type power converter.

* * * * *